United States Patent
Kameda et al.

(10) Patent No.: US 7,259,459 B2
(45) Date of Patent: *Aug. 21, 2007

(54) SEMICONDUCTOR MODULE AND DC-DC CONVERTER

(75) Inventors: Mitsuhiro Kameda, Yokohama (JP); Koichi Sameshima, Fuji (JP)

(73) Assignee: Kabushiki Kaisha Toshiba, Tokyo (JP)

(*) Notice: Subject to any disclaimer, the term of this patent is extended or adjusted under 35 U.S.C. 154(b) by 273 days.

This patent is subject to a terminal disclaimer.

(21) Appl. No.: 10/934,451

(22) Filed: Sep. 7, 2004

(65) Prior Publication Data

US 2005/0029617 A1     Feb. 10, 2005

Related U.S. Application Data

(63) Continuation of application No. 10/438,106, filed on May 15, 2003, now Pat. No. 6,867,494.

(30) Foreign Application Priority Data

May 15, 2002    (JP)    ............................. 2002-140293

(51) Int. Cl.
    *H01L 23/34*    (2006.01)
(52) U.S. Cl. ........................ 257/724; 257/723; 257/773
(58) Field of Classification Search ................ 257/724, 257/723, 773
    See application file for complete search history.

(56) References Cited

U.S. PATENT DOCUMENTS 4,811,065 A    3/1989    Cogan 5,925,910 A    7/1999    Menegoli (Continued)

FOREIGN PATENT DOCUMENTS

JP    5-283448    10/1993

(Continued)

OTHER PUBLICATIONS

Malay Trivedi et al., "Comparison of RF Performance of Vertical and Lateral DMOSFET", Proceedings of the 11th International Symposium on Power Semiconductor Devices and ICS, 1999, pp. 245-248.

(Continued)

*Primary Examiner*—Long Pham
(74) *Attorney, Agent, or Firm*—Oblon, Spivak, McClelland, Maier & Neustadt, P.C.

(57) ABSTRACT

A semiconductor module includes a supporting substrate having a connecting section on a first major surface thereof. A first semiconductor chip includes a first MIS transistor a source of which is formed on the bottom thereof. A second semiconductor chip includes a second MIS transistor a drain of which is formed on the bottom thereof. The first and second semiconductor chips are on the supporting substrate such that the source of the first MIS transistor and the drain of the second MIS transistor are connected to the connecting section and connected each other through the connecting section. An IC chip is provided on the first major surface and connected to gates of the first and second MIS transistors. An insulative envelope covers the supporting substrate, first and second semiconductor chips and IC chip. Partly exposed connecting terminals are electrically connected to the connecting section and first and second semiconductor chips.

12 Claims, 9 Drawing Sheets

U.S. PATENT DOCUMENTS

| | | |
|---|---|---|
| 6,404,050 B2 | 6/2002 | Davis et al. |
| 6,552,390 B2 | 4/2003 | Kameda |
| 6,867,494 B2 * | 3/2005 | Kameda et al. ............. 257/724 |
| 2002/0093094 A1 | 7/2002 | Takagawa et al. |

FOREIGN PATENT DOCUMENTS

| | | |
|---|---|---|
| JP | 8-8395 | 1/1996 |
| JP | 8-130249 | 5/1996 |
| JP | 10-284731 | 10/1998 |
| JP | 2001-60660 | 3/2001 |
| JP | 2002-158353 | 5/2002 |
| JP | 2002-217416 | 8/2002 |

OTHER PUBLICATIONS

Shuming Xu et al., "RF LDMOS with Extreme Low Parasitic Feedback Capacitance and High Hot-Carrier Immunity", Tech. Dig. International Electron Devices Meeting, 1999, pp. 201-204.

Isao Yoshida et al., "Highly Efficient 1.5GHz Si Power MOSFET for Digital Cellular Front End", Proceedings of 1992 International Symposium on Power Semiconductor Devices & ICS, pp. 156-157.

* cited by examiner

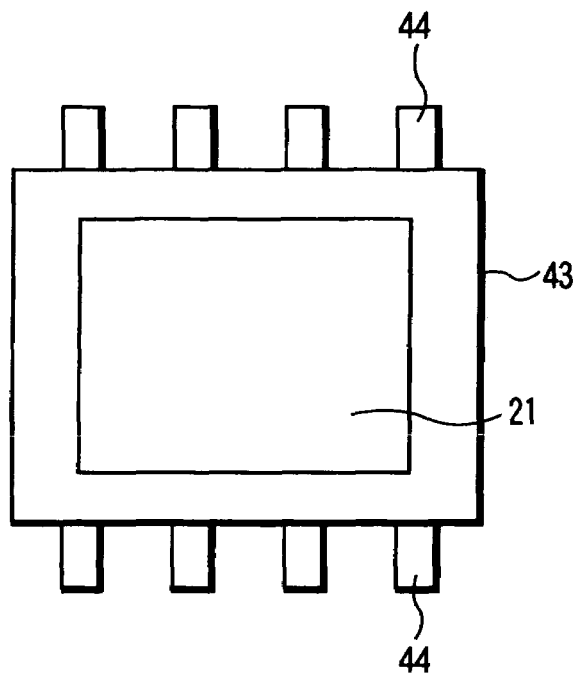
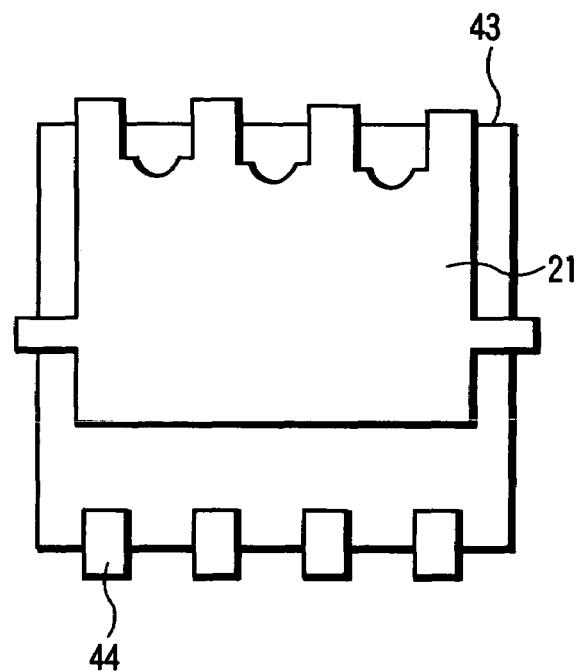
FIG. 7A    FIG. 7B
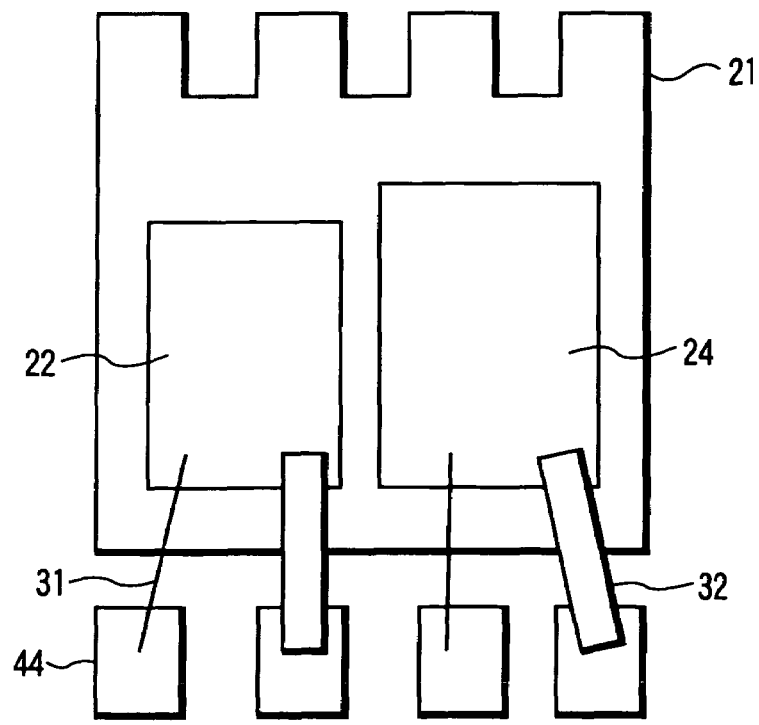
FIG. 8

SEMICONDUCTOR MODULE AND DC-DC CONVERTER

CROSS-REFERENCE TO RELATED APPLICATIONS

This application is based upon and claims the benefit of priority under 35 USC §120 from U.S. Ser. No. 10/438,106, filed May 15, 2003 now U.S. Pat. No. 6,867,494, and from the prior Japanese Patent Application No. 2002-140293, filed May 15, 2002, the entire contents of each are incorporated herein by reference.

BACKGROUND OF THE INVENTION

1. Field of the Invention

The present invention relates to a semiconductor module. Specifically, the invention relates to a semiconductor module including a plurality of semiconductor chips.

2. Description of the Related Art

A DC-DC converter for use in synchronous rectification or the like is known.

FIG. 14 schematically shows a commonly-used circuit of the above DC-DC converter. As shown in FIG. 14, a capacitor Cin is connected between an input terminal Vin to which an input voltage is applied and a ground. The input terminal Vin is connected to the drain of an N-type MIS (metal insulator semiconductor) transistor Q1 whose channel (current path) is of an N type. The MIS transistor includes a MOS (metal oxide semiconductor) transistor. The gate of the MIS transistor Q1 is connected to an IC for DC-DC conversion. The MIS transistor Q1 functions as a switching device.

The source of the MIS transistor Q1 is connected to the drain of an N-type MIS transistor Q2. The source of the MIS transistor Q2 is connected to the ground and the gate thereof is connected to the IC.

A connection node N1 between the source of the MIS transistor Q1 and the drain of the MIS transistor Q2 is connected to the cathode of a diode D1. The anode of the diode D1 is connected to the ground. The connection node N1 is connected to an output terminal Vout via an inductance L. A capacitor Cout is connected in parallel between the output terminal Vout and the ground. $R_L$ indicates a load resistance.

In the foregoing circuit, the MIS transistor Q1 is implemented by a single semiconductor chip 41 and the MIS transistor Q2 is done by a single semiconductor chip 42. Each of the MIS transistors has a known vertical structure as shown in FIG. 15. In this structure, a drain electrode is formed on the bottom of each of the semiconductor chips 41 and 42. In FIG. 15, reference symbols S, D and G denote a source, a drain and a gate, respectively.

FIG. 16A schematically shows an outward appearance of a semiconductor module having semiconductor chips 41 and 42 according to first prior art, and FIG. 16B schematically shows an internal structure of the semiconductor module. The first prior is shown taking a known SOP-8 package as an example. In FIG. 16A, reference numeral 43 indicates a package (envelope) and reference numeral 44 denotes an external connecting terminal part of which is exposed to the semiconductor module. Referring to FIG. 16B, the semiconductor chip 41 or 42, which has the transistor structure as shown in FIG. 15, is mounted on a conductive frame 45 such that the bottom of the chip 41 or 42 contacts the frame 45. The frame 45 is connected to the external connecting terminal 44, and the semiconductor chip 41 or 42 is connected to the external connecting terminal 44 through a wire 46.

As described above, the bottom of the semiconductor chip 41 or 42 serves as a drain electrode. On the other hand, the source of the MIS transistor Q1 and the drain of the MIS transistor Q2 are connected to each other in the DC-DC converter shown in FIG. 14. For this reason, it is impossible to mount the semiconductor chips 41 and 42 on the frame 45 with the frame serving as a common potential. Under present circumstances, the semiconductor chips 41 and 42 are separately sealed with their respective semiconductor modules, and these modules are connected to each other by a wire or the like on a mounting substrate.

It has recently been desired that electronic components such as semiconductor modules be decreased in number and size and increased in operation speed in accordance with miniaturization and high-speed operation of electronic equipment using the above semiconductor modules. To seal the semiconductor chips with separate packages as in the first prior art described above is however contrary to a reduction in component count. The number of wires should be decreased to operate the electronic equipment at high speed. In the first prior art, however, the two semiconductor modules have to be connected to each other by a wire, which prevents the high-speed operation.

FIG. 17 schematically shows the interior of a semiconductor module according to second prior art in order to describe a method of packaging semiconductor chips. Referring to FIG. 17, in the second prior art, two frames 45 are provided and semiconductor chips 41 and 42 are mounted on the frames 45, respectively. The frames 45 are connected to the semiconductor chips 41 and 42 appropriately by wires so as to achieve the circuit arrangement shown in FIG. 14. By doing so, a single semiconductor module can be obtained; however, given wiring is required inside or outside the semiconductor module and the semiconductor module cannot operate at high speed. Since, moreover, an interval Z between the frames 45 depends upon the power supply voltage or the potential of each of the frames, it cannot be set to not larger than a given value, thus imposing restrictions on miniaturization of the semiconductor module.

BRIEF SUMMARY OF THE INVENTION

According to a first aspect of the present invention, there is provided a semiconductor module comprising: a supporting substrate having a first major surface and a conductive connecting section, the connecting section being formed on the first major surface; a first semiconductor chip including a first MIS transistor of a first conductivity type and provided on the supporting substrate, a source of the first MIS transistor being formed on a bottom of the first MIS transistor and connected to the connecting section; a second semiconductor chip including a second MIS transistor of the first conductivity type and provided on the supporting substrate, a drain of the second transistor being formed on a bottom of the second MIS transistor and connected to the connecting section, and the drain of the second MIS transistor being electrically connected to the source of the first MIS transistor through the connecting section; an IC chip provided on the first major surface of the supporting substrate, the IC chip being connected to both a gate of the first MIS transistor and a gate of the second MIS transistor; an insulative envelope which covers the supporting substrate, the first semiconductor chip, the second semiconductor chip, and the IC chip; and connecting terminals electrically connected to the connecting section, the first semiconductor chip, and the second semiconductor chip, connecting terminals being partly exposed from the envelope.

According to a second aspect of the present invention, there is provided a semiconductor module comprising: a supporting substrate having a first major surface and a second major surface opposed to the first major surface and including a conductive connecting section, the connecting section being formed on the first major surface; a first semiconductor chip including a first MIS transistor of a first conductivity type and provided on the supporting substrate, a source of the first MIS transistor being formed on a bottom of the first MIS transistor and connected to the connecting section; a second semiconductor chip including a second MIS transistor of the first conductivity type and provided on the supporting substrate, a drain of the second MIS transistor being formed on a bottom of the second MIS transistor and connected to the connecting section, and the drain of the second MIS transistor being electrically connected to the source of the first MIS transistor through the connecting section; an insulative envelope which covers the supporting substrate, the first semiconductor chip, and the second semiconductor chip, the envelope having an opening through which the second major surface is partly exposed; and a connecting terminals electrically connected to the connecting section, the first semiconductor chip, and the second semiconductor chip, connecting terminals being partly exposed from the envelope.

BRIEF DESCRIPTION OF THE SEVERAL VIEWS OF THE DRAWING

FIGS. 7A and 7B are schematic views of the underside of a semiconductor module according to a second embodiment of the present invention;

FIG. 8 is a schematic view of the interior of a semiconductor module according to a third embodiment of the present invention;

DETAILED DESCRIPTION OF THE INVENTION

Figure 1:
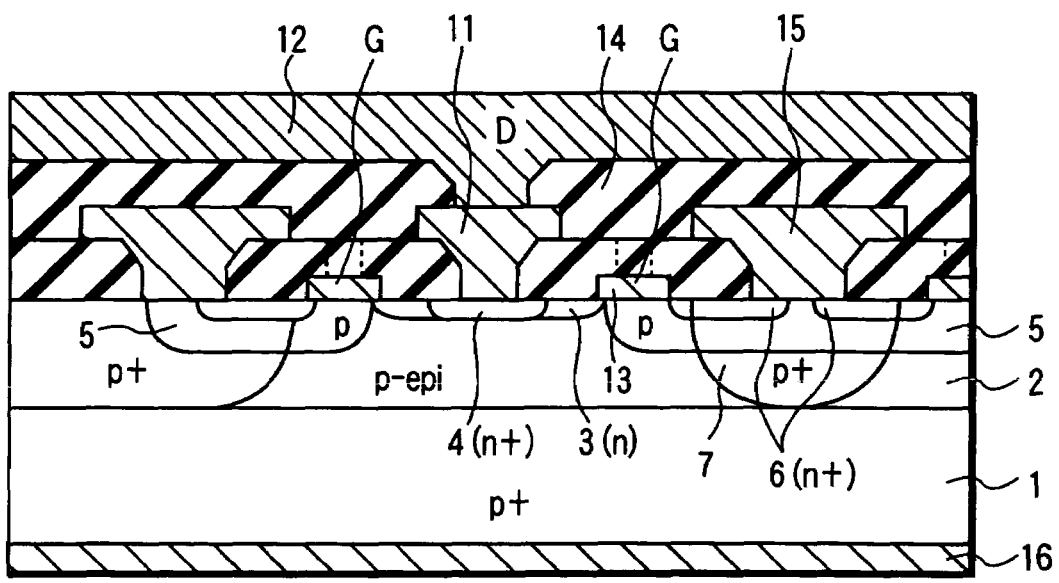
FIG. 1 is a cross-sectional view schematically showing an example of a lateral MIS transistor structure.

An MIS transistor having a so-called lateral structure is known. FIG. 1 schematically shows a section of an example of the lateral structure. Referring to FIG. 1, a p-type epitaxial layer 2 is formed on a p-type semiconductor substrate 1 by, e.g., epitaxial growth. An n-type layer 3 is formed on the surface of the p-type epitaxial layer 2 by, e.g., ion implantation and an $n^+$-type layer 4 is formed in the n-type layer 3. The concentration of the $n^+$-type layer 4 is higher than that of the n-type layer 3. A p-type layer 5 is formed at either end of the n-type layer 3 in the p-type epitaxial layer 2, and $n^+$-type layers 6 are formed in the p-type layer 5 at a given interval. A $p^+$-type layer 7 is formed so as to reach the semiconductor substrate 1 from the $n^+$-type layers 6.

A wiring layer 11 made of conductive materials is formed on the p-type epitaxial layer 2 and over the $n^+$-type layer 4. A drain electrode 12 is formed above the $n^+$-type layer 4. The wiring layer 11 connects the drain electrode 12 and the $n^+$-type layer 4. A gate electrode 13 is formed on the p-type epitaxial layer 2 and between the n-type layer 3 and one of the $n^+$-type layers 6. The wiring layer 11 and gate electrode 13 are insulated from each other by an interlayer insulation film 14. A contact layer 15 is formed on the p-type epitaxial layer 2 and between the $n^+$-type layers 6 in the p-type layer 5. The contact layer 15 is electrically connected to a source electrode 16, which is formed on the entire bottom of the semiconductor substrate 1, through the $p^+$-type layer 7. The above MIS transistor structure is taken as one example. Another type of MIS transistor can be provided if it has only to be so configured that a source electrode is formed on the bottom of the semiconductor substrate.

Embodiments of the present invention, which employ the above-described lateral MIS transistor, will now be described with reference to the accompanying drawings. The components having substantially the same function and structure are denoted by the same reference numerals and they will be described only when the need arises.

FIRST EMBODIMENT

Figure 2:
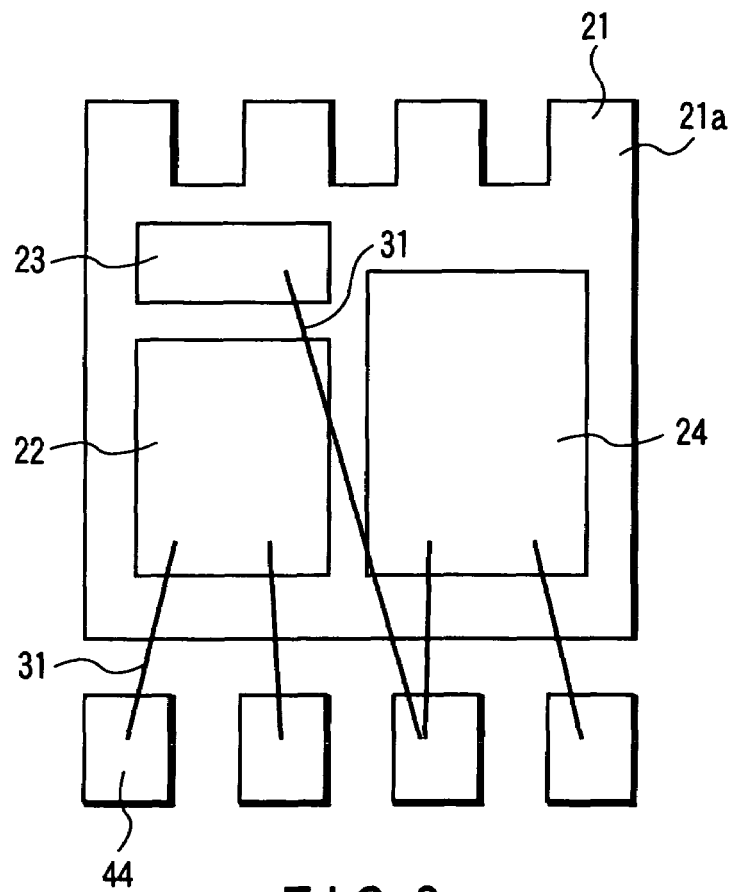
FIG. 2 is a schematic view of the interior of a semiconductor module according to a first embodiment of the present invention.

FIG. 2 schematically shows the interior of a semiconductor module according to a first embodiment of the present invention. Since the outward appearance of the semiconductor module is the same as that of the module shown in FIG. 16A, its descriptions are omitted. In FIG. 2, reference numeral 21 indicates a frame (supporting substrate) of given size. The frame 21 is made of, e.g., conductive materials. A connecting section 21a such as a conductive wiring pattern can be formed on an insulative substrate having good thermal conduction. In this case, semiconductor chips (described later) are connected to each other through the connecting section 21a, and the connecting section 21a is electrically connected to an external connecting terminal. The connecting section 21a can be provided on the entire surface of the frame 21.

A semiconductor chip 22 is mounted on the frame 21 and has an N-type lateral MIS transistor structure as shown in FIG. 1. In other words, a source is formed on the bottom of the semiconductor chip 22 and contacts the frame 21. The semiconductor chip 22 has a function of the MIS transistor Q1 as a switching device of the DC-DC converter illustrated in FIG. 14.

A semiconductor chip 23 is mounted on the frame 21 at a given distance from the semiconductor chip 22. The semiconductor chip 23 has a diode structure whose bottom serves as a cathode that contacts the frame 21. The semiconductor chip 23 has a function of the diode D1 of the DC-DC converter shown in FIG. 14.

Figure 15:
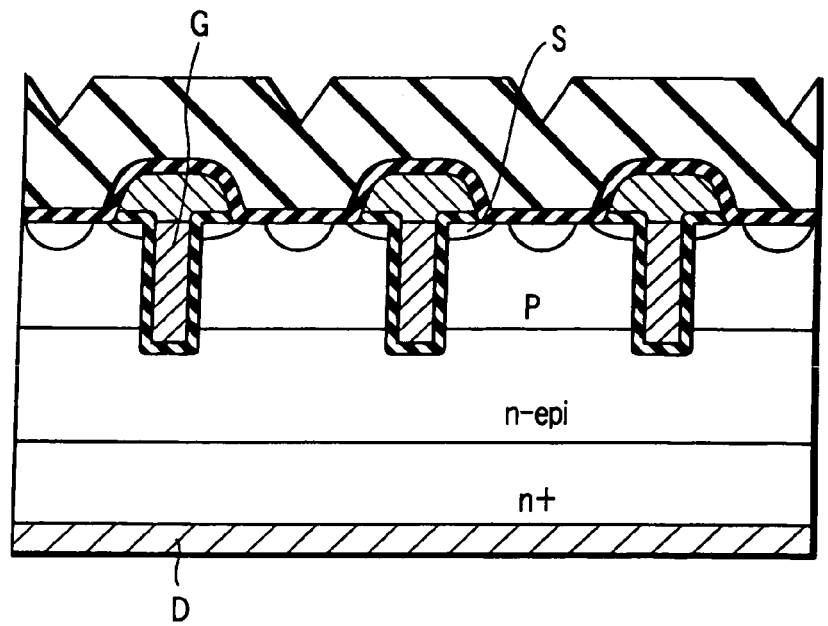
FIG. 15 is a cross-sectional view schematically showing an example of a vertical MIS transistor structure.

A semiconductor chip 24 is mounted on the frame 21 at a given distance from the semiconductor chip 23. The semiconductor chip 23 has an N-type vertical MIS transistor structure as shown in FIG. 15. In other words, a drain is formed on the bottom of the semiconductor chip 24 and contacts the frame 21.

Figure 16A:
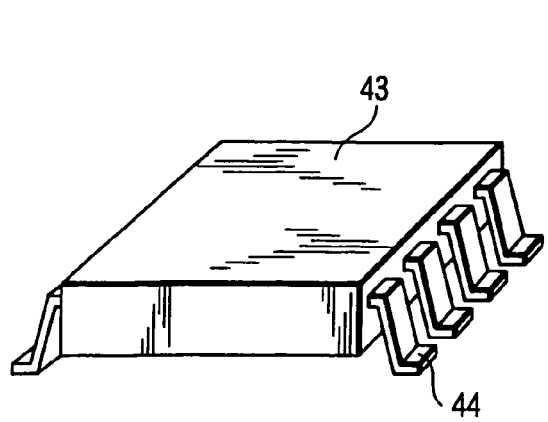
FIGS. 16A and 16B are schematic views of a semiconductor module according to first prior art.
Figure 16B:
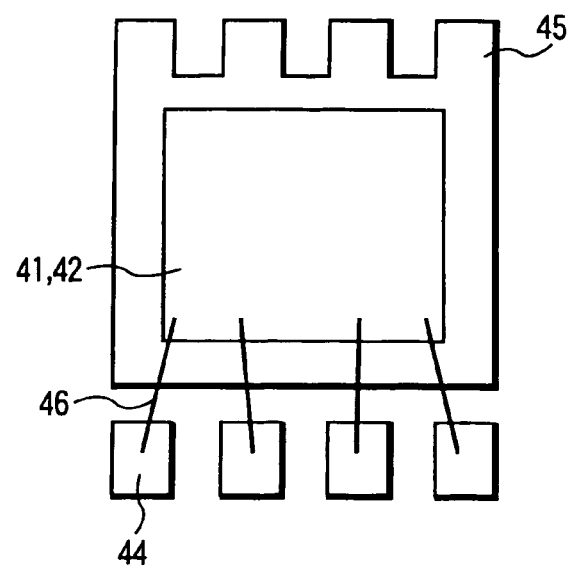
Figure 17:
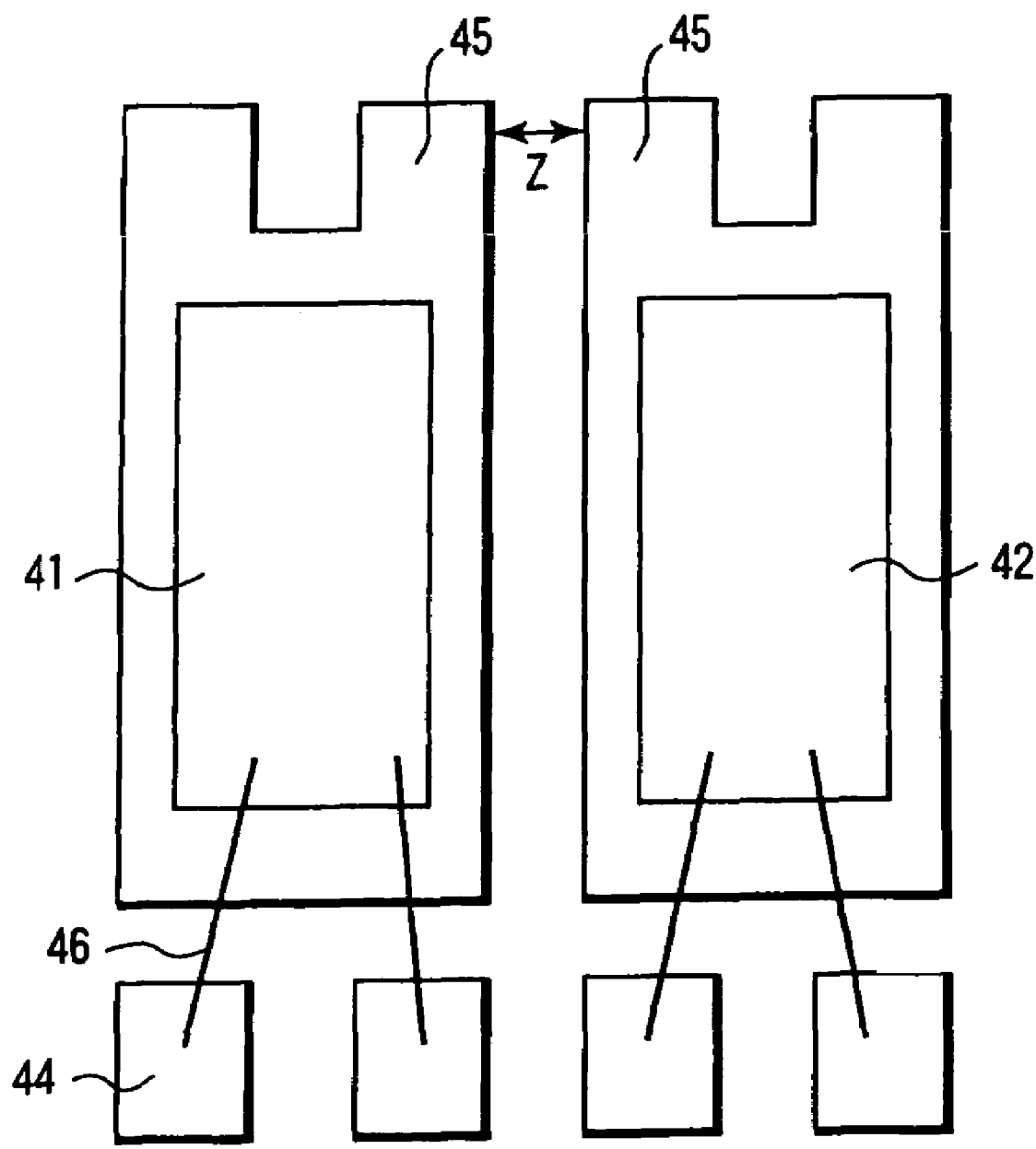
FIG. 17 is a schematic view of a semiconductor module according to second prior art to describe a method of packaging semiconductor chips.

The terminal of the semiconductor chip 23, which serves as an anode, is connected to an external connecting terminal 44 of the chip 24, which corresponds to that shown in FIG. 16A, through a wire 31. The semiconductor chip 22, semiconductor substrate 23 and semiconductor chip 24 are electrically connected to each other with the frame 21 as a common potential. Both a drain and a gate provided on the top of the semiconductor chip 22 are connected to given external connecting terminals 44 through wires 31, as are both a source and a gate provided on the top of the semiconductor chip 24.

The frame 21 is connected to the external connecting terminals 44. The frame 21, semiconductor chips 22, 23 and 24 and some of the external connecting terminals 44 are sealed with a package to form a semiconductor module.

Figure 3:
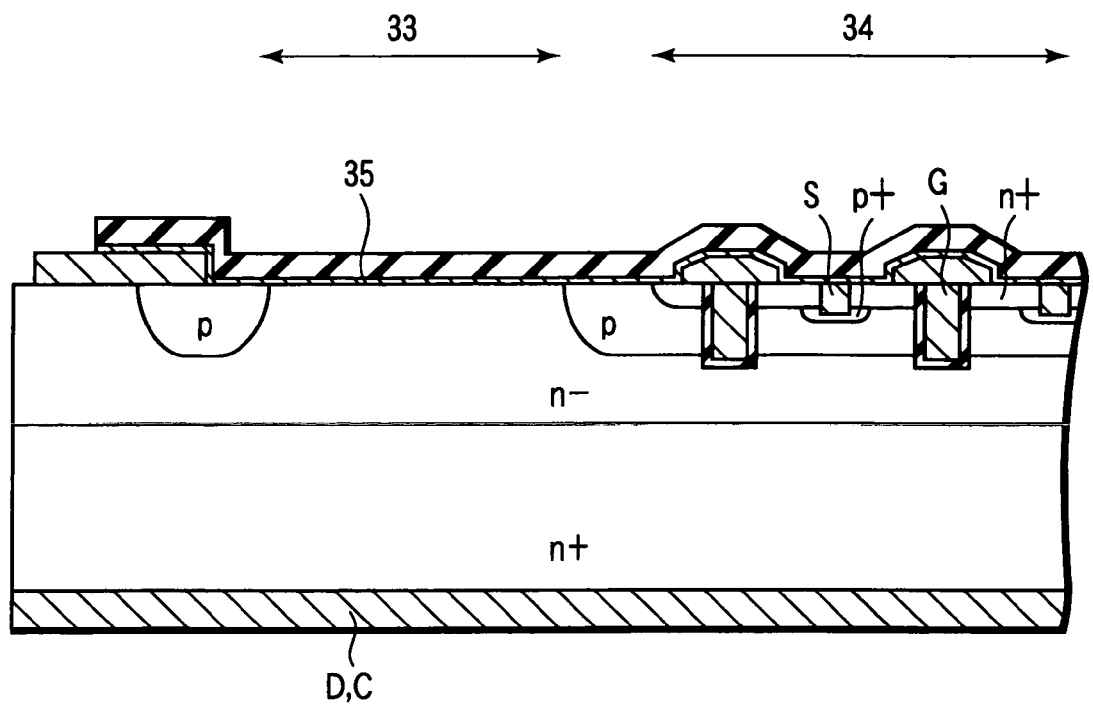
FIG. 3 is a cross-sectional view schematically showing a semiconductor chip of a semiconductor module according to a first modification to the first embodiment of the present invention.
Figure 14:
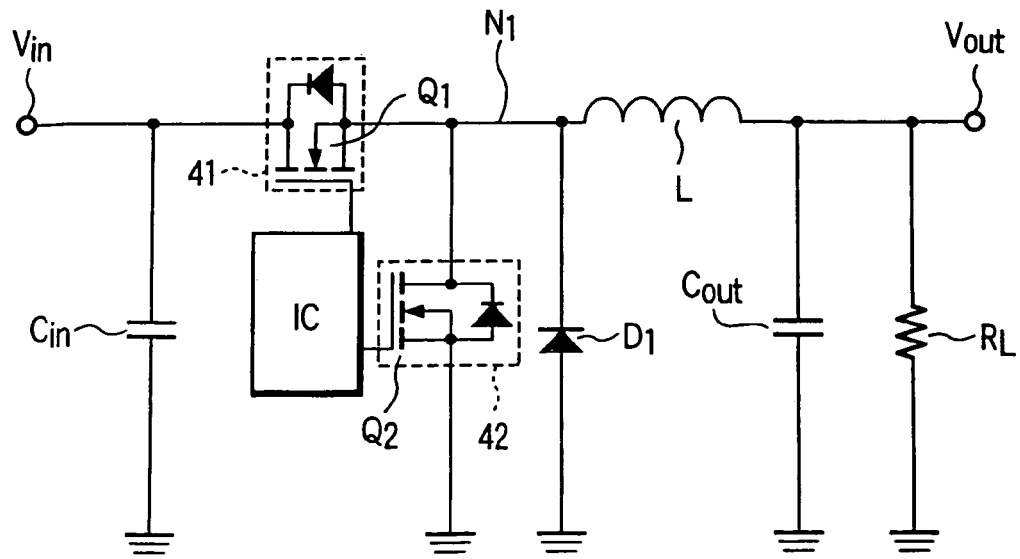
FIG. 14 is a circuit diagram of a commonly-used DC-DC converter.

In the first embodiment, the diode D1 of the circuit shown in FIG. 14 is arranged on the frame 21 as an independent semiconductor chip. However, the first embodiment is not limited to this arrangement. For example, the diode D1 can be formed within the semiconductor chip 24 of the vertical MIS transistor structure. FIG. 3 schematically shows a section of a semiconductor chip according to a first modification to the first embodiment of the present invention. The semiconductor chip shown in FIG. 3 includes a diode 33 such as a Schottky barrier diode as well as an MIS transistor 34. In FIG. 3, reference numeral 35 denotes barrier metal. The cathode C of the diode 33 serves as the drain D of the MIS transistor 34, too. Using a semiconductor chip of such a structure, the number of semiconductor chips can be decreased more than when the diode D1 serves as an independent semiconductor chip.

Figure 4:
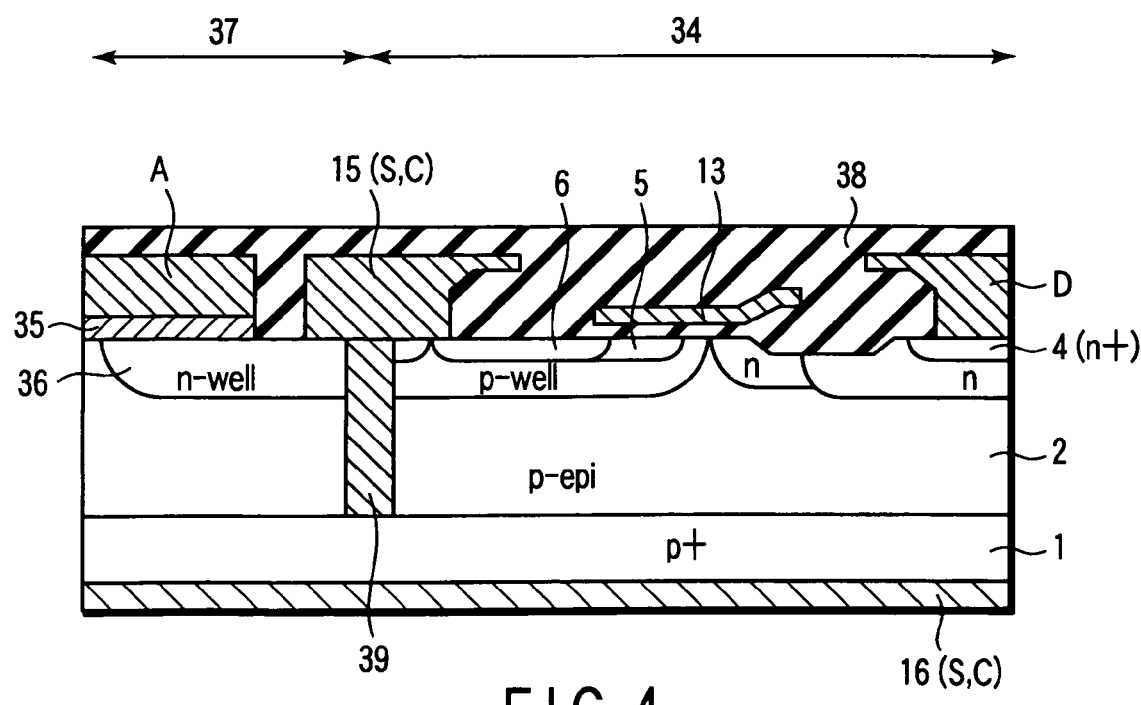
FIG. 4 is a cross-sectional view schematically showing a semiconductor chip of a semiconductor module according to a second modification to the first embodiment of the present invention.

The diode D1 can also be formed within the semiconductor chip 22 of the lateral MIS transistor structure. FIG. 4 schematically shows a section of a semiconductor chip according to a second modification to the first embodiment of the present invention. Referring to FIG. 4, in a diode-forming region (diode) 37, an anode electrode A is formed on an n-type well layer 36 with the barrier metal 35 interposed therebetween. A cathode 15 of the diode 37 is provided so that an oxide silicon film 38 is provided between the anode electrode A and the cathode 15. The cathode 15 also serves as the source S of the MIS transistor 34. This cathode/source 15 is connected to a cathode/source electrode 16 through a connecting layer 39. Using a semiconductor chip of such a structure, the number of semiconductor chips can be reduced further as in the first modification.

Figure 5:
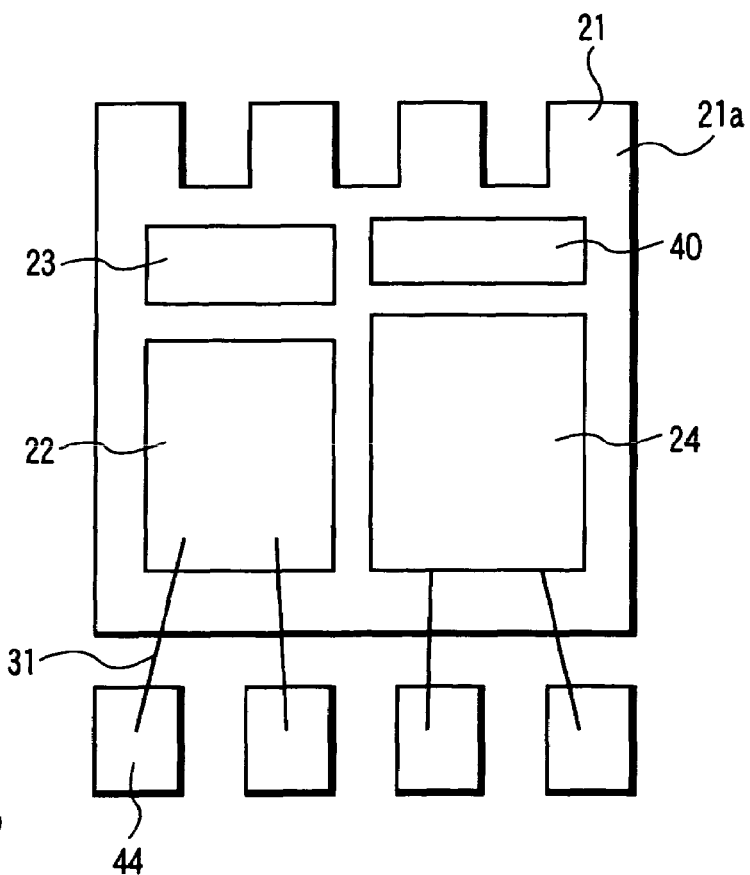
FIG. 5 is a schematic view of the interior of a semiconductor module according to a third modification to the first embodiment of the present invention.

An IC chip of the DC-DC converter shown in FIG. 14 can be included in the semiconductor module. FIG. 5 schematically shows the interior of a semiconductor module according to a third modification to the first embodiment of the present invention. Referring to FIG. 5, an IC chip 40 can be mounted on the frame 21 with insulating materials (not shown) interposed therebetween. The IC chip is connected to the external connecting terminals and semiconductor chips 22 to 24 through the wires 31. With such a semiconductor module, the number of semiconductor modules can be decreased more than when the IC chip 40 serves as an independent semiconductor module.

In FIG. 2, the semiconductor chips 22 and 23 are arranged on the left side of the frame 21 and the semiconductor chip 24 is arranged on the right side thereof. The first embodiment is not limited to this arrangement. These semiconductor chips have only to be arranged such that the frame 21 serves as their common potential. It is needless to say that the position of the IC chip 40 is not limited to that shown in FIG. 5.

The first embodiment of the present invention is directed to a semiconductor module used for composing a circuit having two MIS transistors and using a source of one of the MIS transistors and a drain of the other as potentials common to the MIS transistors. In this semiconductor module, both the semiconductor chip 22 of an MIS transistor structure whose bottom serves as a source and the semiconductor chip 24 of an MIS transistor structure whose bottom serves as a drain are arranged on the single frame 21. The total number of semiconductor modules is therefore smaller than that in the first prior art. Electronic equipment including such a semiconductor module can be decreased in size. Since the space, which would be necessary between frames in the second prior art, need not be formed, the semiconductor module can be decreased in size more than that of the second prior art.

In the first embodiment, a semiconductor module need not be provided for each MIS transistor. The semiconductor modules need not be connected by, e.g., a wire unlike in the first prior art or the frames need not be connected by, e.g., a wire inside or outside a semiconductor module unlike in the second prior art. Resistance and inductance caused by the wire can thus be eliminated; accordingly, the semiconductor modules can be operated with stability and at high speed.

A plurality of semiconductor chips can be mounted on a single frame. It is thus unnecessary to take into consideration the coplanarity of the frame when the semiconductor chips are mounted on the frame.

Since two frames need not be provided within a semiconductor module unlike in the second prior art, the area of the frame 21 can be increased. Heat can thus be dispersed more effectively than that in the second prior art. Since heat moves through the frame 21, it can be uniformed on the frame. Assume that the maximum assurance temperature of one of the semiconductor chips (e.g., semiconductor chip 22) is 150° C. If, in this case, the power loss of the semiconductor chip 22 increases and the temperatures of the semiconductor chips 22 and 24 reach 160° C. and 110° C., respectively, then the semiconductor module becomes unworkable. According to the first embodiment, however, heat generated from the semiconductor chip 22 can be moved to the semiconductor chip 24 and uniformed on the frame 21. Consequently, the possibility that the temperature of each of the semiconductor chips exceeds the maximum assurance temperature can be decreased.

SECOND EMBODIMENT

Figure 6:
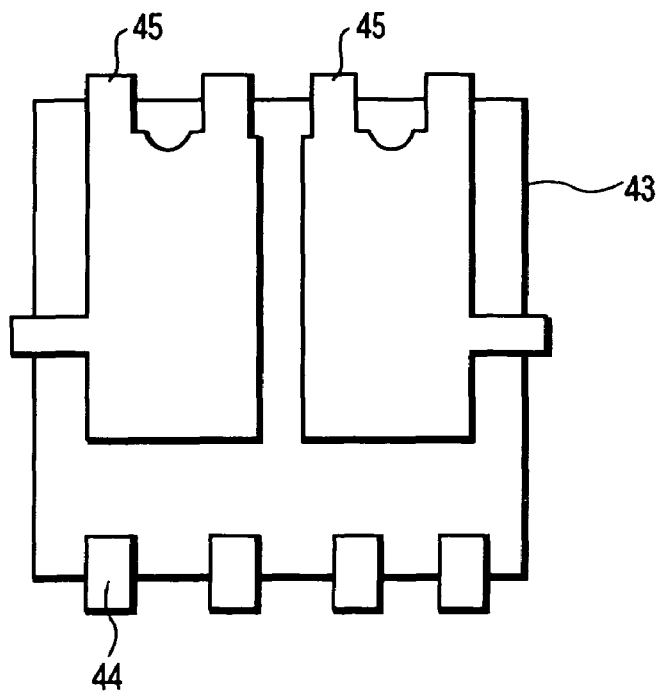
FIG. 6 is a schematic view of the underside of a semiconductor module according to second prior art.

The second embodiment is a modification to the first embodiment. In the semiconductor module of the second prior art, too, a radiation effect can be improved by exposing each of frames 45 to the underside of a package as shown in FIG. 6. Since, however, the number of frames 45 is two or more, the coplanarity of each of the frames 45 has to be considered in the manufacturing process of the semiconductor module. Poor coplanarity decreases the radiation effect of each of the frames 45 and causes trouble when the semiconductor module is mounted on a mounting substrate or the like. In the second embodiment, therefore, a frame, which is common to the two semiconductor chips in the semiconductor module of the first embodiment, is exposed to the underside of the package.

FIGS. 7A and 7B are plan views schematically showing the underside of a semiconductor module according to the second embodiment of the present invention. Referring to FIG. 7A, an opening is formed in the underside of a package 43 and part of a frame 21 is exposed through the opening. Referring to FIG. 7B, the frame 21 can be formed integrally with external connecting terminals 44 as one component and exposed to the package 43. In this case, the area of the exposed part of the frame 21 can be increased. The frame 21 and external connecting terminals 44 can be connected inside the package 43 as shown in FIG. 7A or outside the package 43 as shown in FIG. 7B. Since the other structure is the same as that of the first embodiment, its descriptions are omitted.

The semiconductor module according to the second embodiment produces the same advantage as that of the semiconductor module according to the first embodiment. Further, since part of the frame 21 common to the semiconductor chips is exposed to the underside of the package 43, the area of the exposed part can be increased; accordingly, the radiation effect can be made greater than that in the second prior art.

Moreover, unlike in the second prior art, a semiconductor module can be formed without considering any coplanarity of two frames. It is thus possible to prevent trouble from occurring when such a semiconductor module is mounted on a mounting substrate. Consequently, the yield of semiconductor modules can be improved and the manufacturing costs thereof can be lowered.

THIRD EMBODIMENT

In the foregoing first and second embodiments, the semiconductor chips in the semiconductor module and external connecting terminals are connected by wires, respectively. In the third embodiment, some of these connections are implemented by a strap structure.

FIG. 8 is a plan view schematically showing the interior of a package 43 of a semiconductor module according to the third embodiment of the present invention. Referring to FIG. 8, a semiconductor chip 22 and an external connecting terminal 44 are connected to each other by a conductive member 32 of a planar structure or a strap structure having a given width, as are a semiconductor chip 24 and an external connecting terminal 44. Since the other structure is the same as that of the first embodiment, its descriptions are omitted.

The semiconductor module according to the third embodiment produces the same advantage as that of the first embodiment. Further, since the semiconductor chips 22 and 24 are connected to the external connecting terminals 44 by the conductive members 32 of the strap structure, more heat can radiate from the semiconductor chips 22 and 24. Furthermore, wiring resistance and inductance can be lowered more than when they are connected by wires 31.

Figure 9:
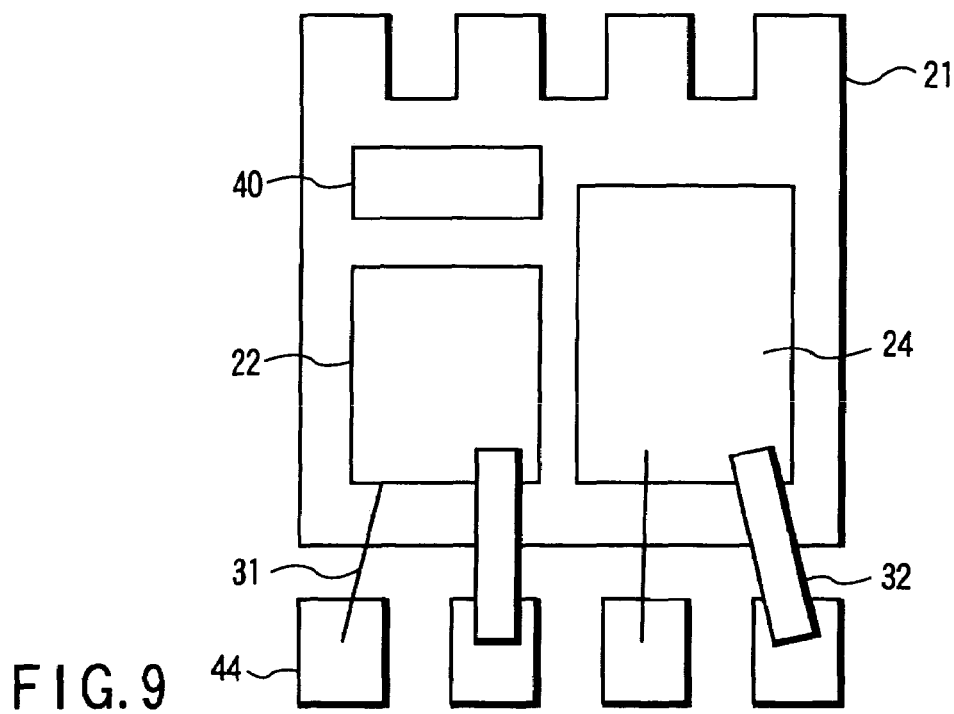
FIG. 9 is a schematic view of the interior of a semiconductor module according to a modification to the third embodiment of the present invention.

FIG. 9 schematically shows the interior of a semiconductor module according to a modification to the third embodiment. An IC chip 40 is provided in a semiconductor module. The modification produces the same advantage as that of the first embodiment.

FOURTH EMBODIMENT

The first to third embodiments are directed to two semiconductor chips. In contrast, the fourth embodiment is directed to three or more semiconductor chips.

Figure 10:
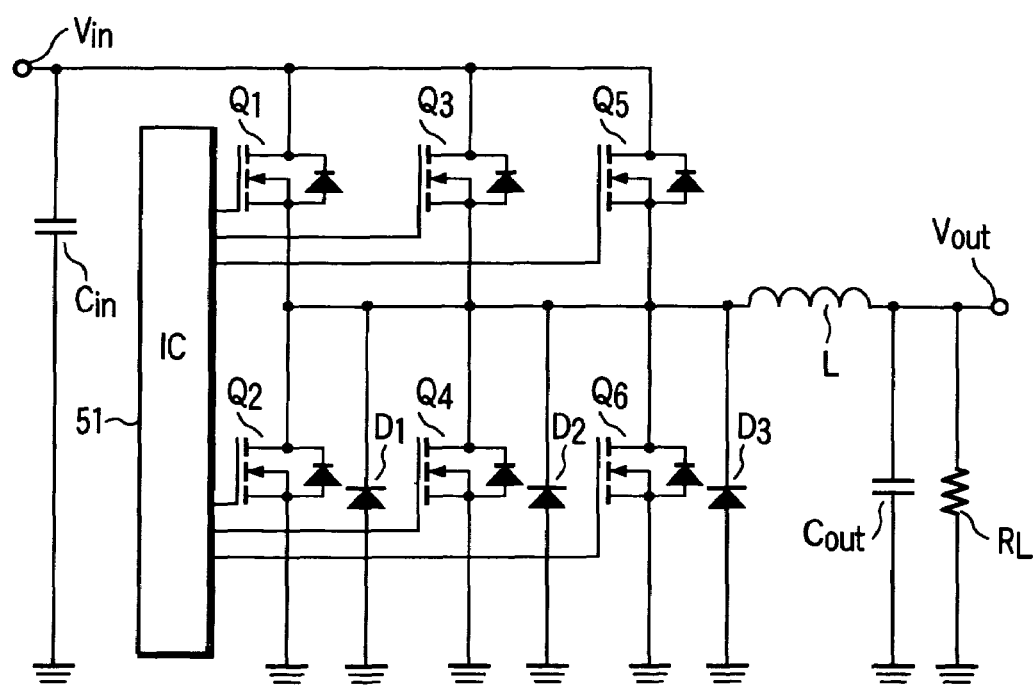
FIG. 10 is a circuit diagram showing a multi-phased circuit of a DC-DC converter as shown in FIG. 14.

FIG. 10 shows a multi-phased circuit, e.g., a three-phased circuit of a DC-DC converter as shown in FIG. 14. In the circuit shown in FIG. 10, one master clock is divided into three to alternately operate three DC-DC converters and increase the operating frequency of the entire DC-DC converters. One DC-DC converter is made up of a transistor Q1, a transistor Q2 and a diode D1, another DC-DC converter is made up of a transistor Q3, a transistor Q4 and a diode D2, and the other DC-DC converter is made up of a transistor Q5, a transistor Q6 and a diode D3. The transistors and diodes of these DC-DC converters are connected to each other as those of the DC-DC converter shown in FIG. 14. The other circuit arrangement is the same as that shown in FIG. 14.

Figure 11:
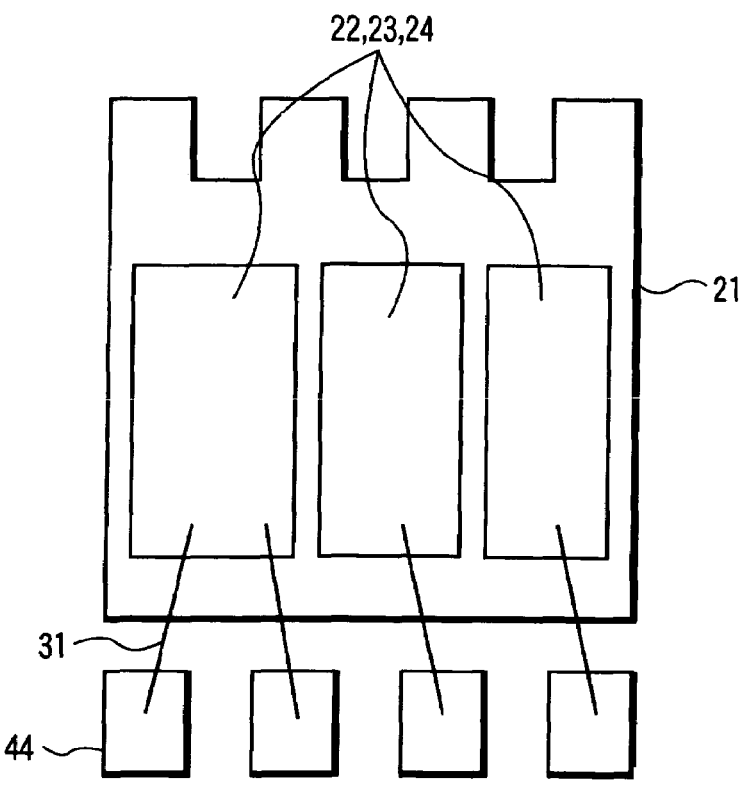
FIG. 11 is a schematic view of the interior of a semiconductor module according to a fourth embodiment of the present invention.

FIG. 11 schematically shows the interior of a semiconductor module according to the fourth embodiment of the present invention. For example, in the three-phased DC-DC converter, each phase requires semiconductor chips 22 and 24 each serving as a switching device and a semiconductor chip 23 having a diode function. A single semiconductor module therefore includes the semiconductor chips 22, 23 and 24.

As illustrated in FIG. 11, semiconductor chips by the required number are arranged on a frame 21. A semiconductor chip 22 having a lateral MIS transistor structure is used as a chip whose source needs to be connected to the frame 21. A vertical semiconductor chip 24 is used as a chip whose drain needs to be connected to the frame 21. Each semiconductor chip is connected to given external connecting terminals 44 by wires 31. Since the other structure is the same as that of the first embodiment, its descriptions are omitted.

The semiconductor module according to the fourth embodiment produces the same advantage as that of the first embodiment. A plurality of semiconductor chips can be provided in a single module by appropriately selecting them as ones having a lateral or vertical MIS transistor structure and using the frame 21 as a common potential. For this reason, a switching device required for, e.g., a multi-phased DC-DC converter can be provided in a single semiconductor module.

Figure 12:
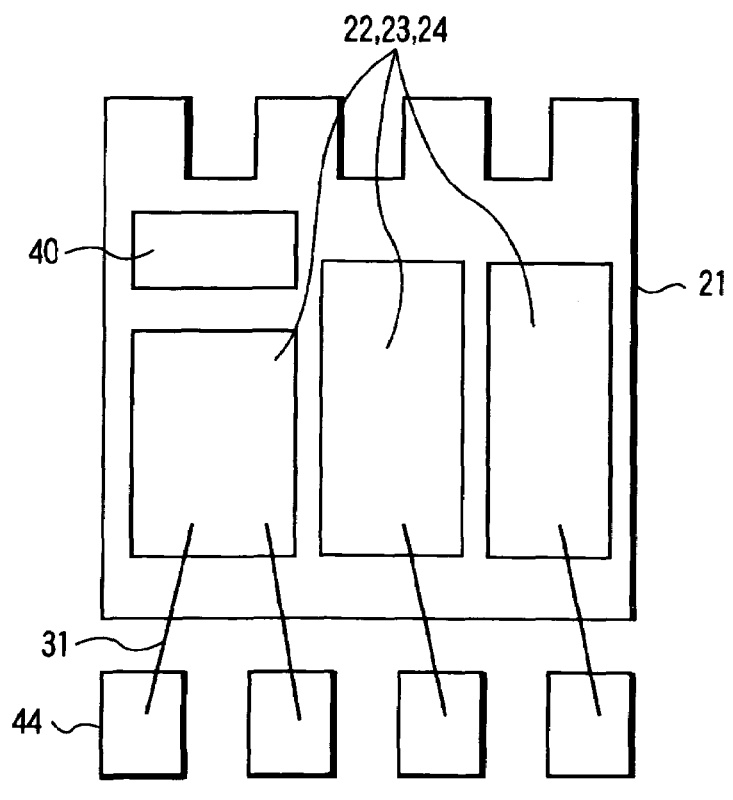
FIG. 12 is a schematic view of the interior of a semiconductor module according to a modification to the fourth embodiment of the present invention.

FIG. 12 schematically shows the interior of a semiconductor module according to a modification to the fourth embodiment. Since the semiconductor module includes an IC chip 40, the modification produces the same advantage as that of the first embodiment.

Needless to say, the techniques of the modifications to the first embodiment and those of the second and third embodiments can be applied to the modification to the fourth embodiment.

Figure 13:
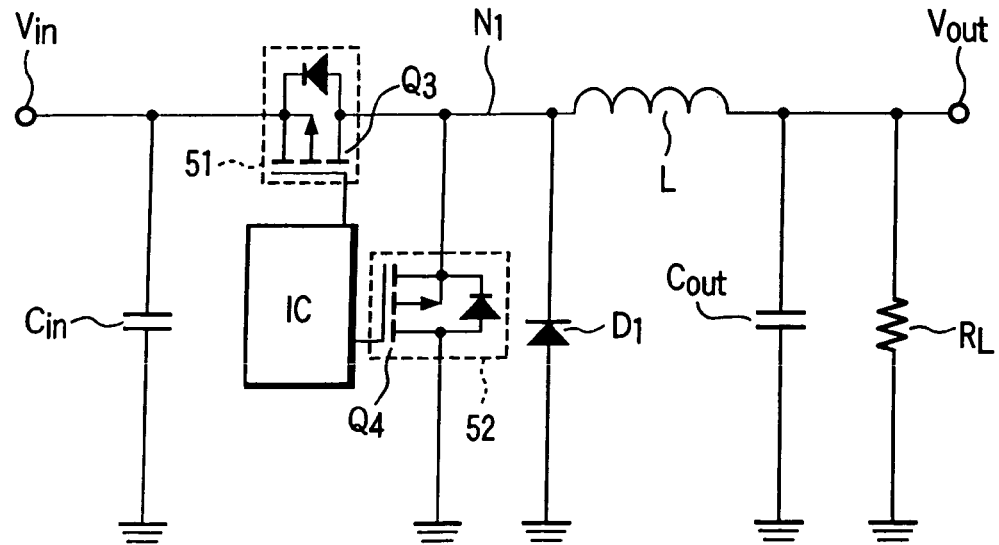
FIG. 13 is a circuit diagram showing an example of a DC-DC converter.

In the first to fourth embodiments, an N-type MIS transistor is used as a switching device of the circuit shown in FIG. 14. The present invention is not limited to this use, but a P-type MIS transistor can be used. In other words, the first to third embodiments can be employed if the conductivity types of two MIS transistors are the same. FIG. 13 shows an example of a DC-DC converter using a P-type MIS transistor as a switching device. In FIG. 13, reference numerals Q3 and Q4 indicate P-type MIS transistors. The source of the MIS transistor Q3 is connected to an input terminal Vin and the drain thereof is connected to a connection node N1. The source of the MIS transistor Q4 is connected to the connection node N1 and the drain thereof is grounded. The other circuit arrangement is the same as that shown in FIG. 14.

When a P-type MIS transistor is used for a switching device, the positions of the source and drain of each of the MIS transistors Q3 and Q4 differ from those in an N-type MIS transistor. Thus, a semiconductor chip of a vertical MIS transistor structure whose bottom serves as a drain is used as a semiconductor chip 51 including the MIS transistor Q3. Such a semiconductor chip has a structure in which the conductivity types of the semiconductor chip shown in FIG. 15 are inverted. Similarly, a semiconductor chip of a lateral MIS transistor structure whose bottom serves as a source is used as a semiconductor chip 52 including the MIS transistor Q4. Such a semiconductor chip has a structure in which the conductivity types of the semiconductor chip shown in FIG. 1 are inverted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor module comprising:
   a conductive plate having a first surface;
   a first semiconductor chip including a first MIS transistor, a source electrode of the first MIS transistor being formed on a bottom of the first semiconductor chip and connected to the first surface of the conductive plate;
   a second semiconductor chip including a second MIS transistor, a drain electrode of the second MIS transistor being formed on a bottom of the second semiconductor chip and connected to the first surface of the conductive plate, and the drain electrode of the second MIS transistor being electrically connected to the source electrode of the first MIS transistor through the conductive plate;
   an IC chip electrically connected to both a gate electrode of the first MIS transistor formed on a top of the first semiconductor chip and a gate electrode of the second MIS transistor formed on a top of the second semiconductor chip;
   an insulative envelope covering the conductive plate, the first semiconductor chip, the second semiconductor chip, and the IC chip; and
   connecting terminals electrically connected to the conductive plate, the first semiconductor chip, and the second semiconductor chip, the connecting terminals being partly exposed from the envelope.

2. The semiconductor module according to claim 1, wherein the conductive plate is a frame made of conductive material.

3. The semiconductor module according to claim 1, wherein the IC chip makes up a DC-DC converter.

4. The semiconductor module according to claim 1, wherein one of the connecting terminals is connected to a drain electrode which is formed on a top of the first semiconductor chip.

5. The semiconductor module according to claim 1, wherein one of the connecting terminals is connected to a source electrode which is formed on a top of the second semiconductor chip.

6. The semiconductor module according to claim 1, wherein the envelope has an opening through which a second surface of the conductive plate, which is opposite to the first surface, is partly exposed.

7. The semiconductor module according to claim 6, wherein the connecting terminals are part of the conductive plate.

8. The semiconductor module according to claim 1, wherein the connecting terminals are connected to the first semiconductor chip and the second semiconductor chip by wires.

9. The semiconductor module according to claim 8, wherein at least one of the wires is a metal plate.

10. A DC-DC converter, comprising:
    a semiconductor module, comprising:
        a conductive plate having a first surface;
        a first semiconductor chip including a first MIS transistor, a source electrode of the first MIS transistor being formed on a bottom of the first semiconductor chip and connected to the first surface of the conductive plate;
        a second semiconductor chip including a second MIS transistor, a drain electrode of the second MIS transistor being formed on a bottom of the second semiconductor chip and connected to the first surface of the conductive plate, and the drain electrode of the second MIS transistor being electrically connected to the source electrode of the first MIS transistor through the conductive plate;
        an IC chip electrically connected to both a gate electrode of the first MIS transistor formed on a top of the first semiconductor chip and a gate electrode of the second MIS transistor formed on a top of the second semiconductor chip;
        an insulative envelope covering the conductive plate, the first semiconductor chip, the second semiconductor chip, and the IC chip; and
        connecting terminals electrically connected to the conductive plate, the first semiconductor chip, and the second semiconductor chip, the connecting terminals being partly exposed from the envelope,
    wherein a drain electrode of the first MIS transistor is provided with an input voltage of the DC-DC converter.

11. The DC-DC converter according to claim 10, wherein a source electrode of the second MIS transistor is connected to a ground.

12. The DC-DC converter according to claim 10, wherein the conductive plate is connected to an output terminal of the DC-DC converter via an inductance.

* * * * *